(12) United States Patent
Martin

(10) Patent No.: US 6,763,946 B1
(45) Date of Patent: Jul. 20, 2004

(54) HOLDER FOR REMOVABLE MEMORY COMPONENT

(75) Inventor: Dannie E. Martin, Casselberry, FL (US)

(73) Assignee: BellSouth Intellectual Property Corporation, Wilmington, DE (US)

(*) Notice: Subject to any disclaimer, the term of this patent is extended or adjusted under 35 U.S.C. 154(b) by 84 days.

(21) Appl. No.: 10/029,901

(22) Filed: Dec. 18, 2001

(51) Int. Cl.[7] .............................................. B65D 85/00
(52) U.S. Cl. .................... 206/701; 206/316.2; 206/578; 206/720; 224/908
(58) Field of Search ................................ 206/305, 320, 206/701, 713, 719, 720–723, 231, 234, 37–39, 316.1, 316.2, 578; 224/236, 901.2, 901.4, 901.6, 901.8; 383/110; 428/922; 396/544

(56) References Cited

U.S. PATENT DOCUMENTS

| | | | | |
|---|---|---|---|---|
| 4,471,872 A | * | 9/1984 | Dedow | 206/720 |
| 4,896,805 A | * | 1/1990 | Klaczak et al. | 224/901.4 |
| 4,906,494 A | * | 3/1990 | Babinec et al. | 206/720 |
| 5,526,924 A | * | 6/1996 | Klutznick | 224/901.4 |
| 5,676,242 A | * | 10/1997 | Scott | 206/5 |
| 5,791,485 A | * | 8/1998 | Carbonneau | 206/720 |
| 5,938,096 A | * | 8/1999 | Sauer et al. | 206/320 |
| 6,182,878 B1 | * | 2/2001 | Racca | 224/901.4 |

* cited by examiner

Primary Examiner—Luan K. Bui
(74) Attorney, Agent, or Firm—Kirkpatrick & Lockhart LLP

(57) ABSTRACT

A holder for a removable memory component of a portable electronic device. The holder includes an electro-statically protective and securely closable pocket removably attachable to the device.

18 Claims, 5 Drawing Sheets

HOLDER FOR REMOVABLE MEMORY COMPONENT

BACKGROUND OF THE INVENTION

1. Field of the Invention

The invention relates to a holder for a removable memory component of a portable electronic device.

2. Description of the Invention Background

Many handheld or portable electronic devices, such as, for example, digital cameras, digital audio players, handheld games, puzzles, dictionaries, personal assistants, microcomputers and the like, are provided with additional memory components or chips that enhance their memory size and performance or provide other capabilities, such as a different game, a foreign language dictionary, a map of a different area and so on.

These memory components, which come in a variety of sizes and shapes, but are commonly small and lightweight, are susceptible to damage by electrostatic discharges or to breakage by careless handling. Yet, they are meant to be carried around with the devices for which they are intended and need to be easily accessible. Because of their size, such memory components can be easily misplaced, squeezed in a carrying case for the device or fall out from a person's pocket. They may also be exposed to harmful electrostatic discharges.

There remains, therefore, a need for a holder for a memory component of a device that can easily and inexpensively protect and transport the memory component with the device without the shortcomings associated with other arrangements.

SUMMARY

One embodiment of the invention provides a holder for a removable memory component of a device. The holder includes a body having a pocket therein. The pocket is sized to receive at least one memory component through a pocket opening in the body. The holder also includes a reclosable pocket closure attached to the pocket and completely covering the pocket. The holder also includes a retainer for removably attaching the body to a portion of the device.

BRIEF DESCRIPTION OF THE DRAWINGS

In the accompanying Figures, there are shown present embodiments of the invention wherein like reference numerals are employed to designate like parts and wherein.

DETAILED DESCRIPTION OF THE INVENTION

Figure 1:
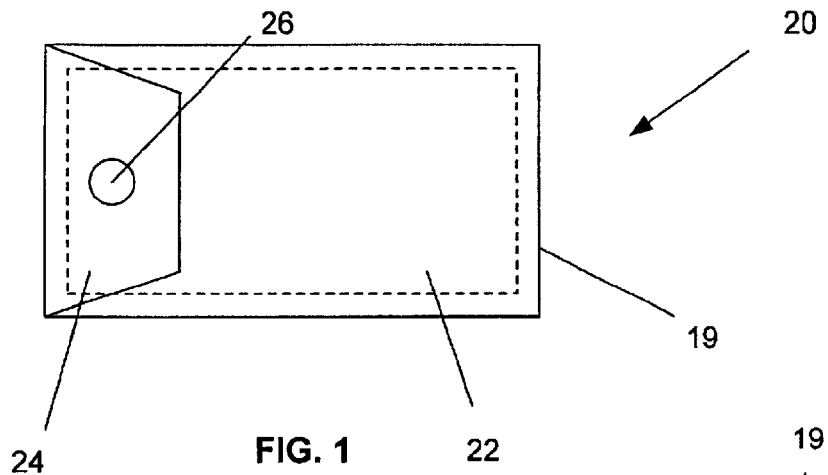
FIG. 1 is a front view of an embodiment of a memory holder according to the present invention showing the memory holder in a closed position.

Referring now to the drawings for the purpose of illustrating the invention and not for the purpose of limiting the same, it is to be understood that standard components or features that are within the purview of an artisan of ordinary skill and do not contribute to the understanding of the various embodiments of the invention are omitted from the drawings to enhance clarity.

Figure 2:
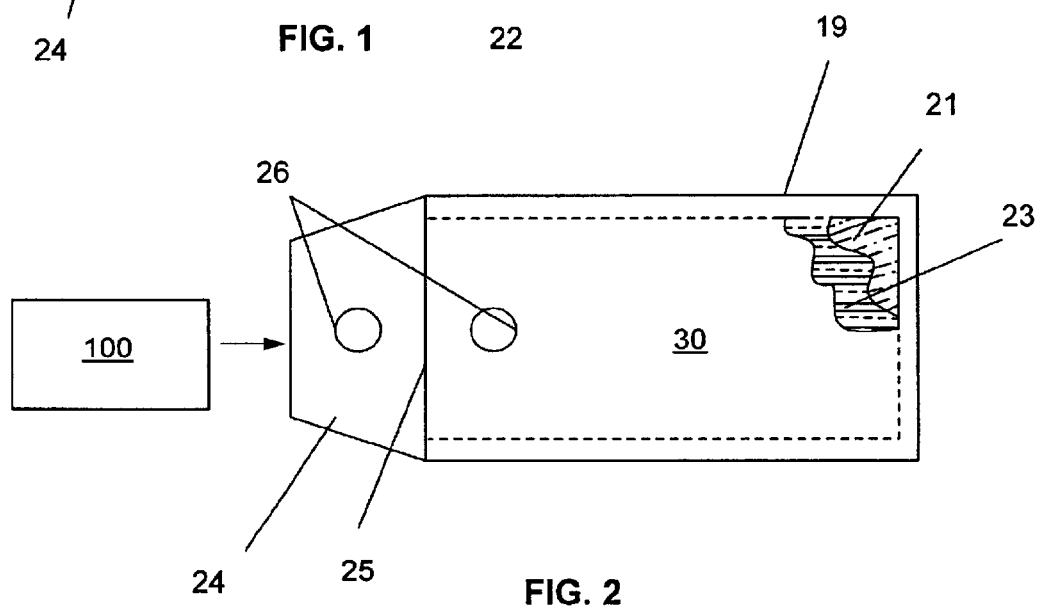
FIG. 2 is a front view of he holder of FIG. 1, showing the memory holder in an open position to receive a memory component.
Figure 6:
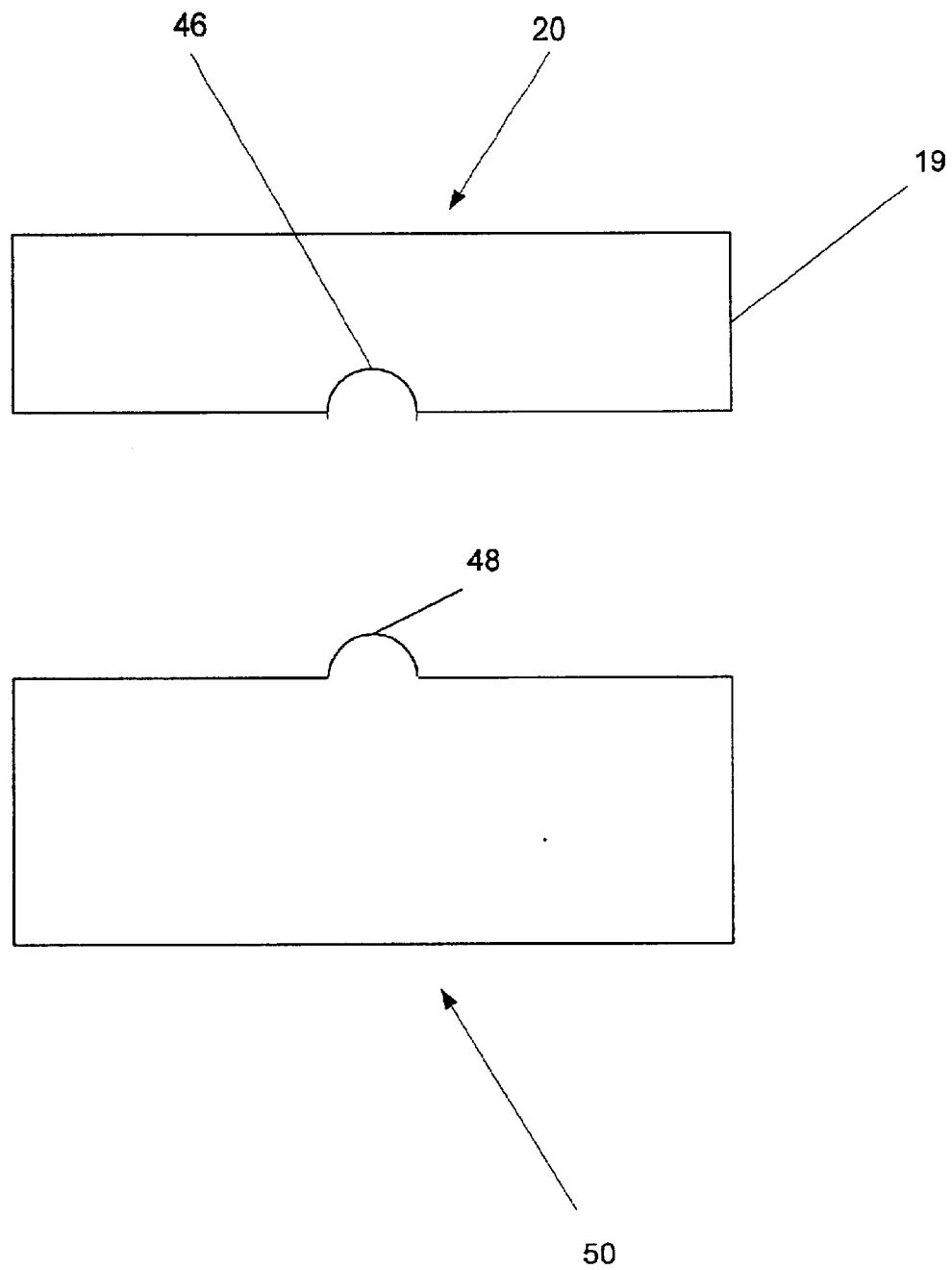
FIG. 6 is a side view of an embodiment of a memory holder according to the present invention, wherein the memory holder is shown apart from a device to which it is attachable.

FIG. 1 is a front view of an embodiment of a holder for a memory component of an electronic device according to the present invention, hereinafter "the memory holder 20". The memory holder 20 includes a body 19 which forms a pocket 22 that is sized to receive at least one memory component 100 therein. The body 19 has at least one opening 25 through which the memory component 100 may be inserted. See FIG. 2. The memory components 100 may be, for example, flash memory cards, memory sticks or a smart media cards of the type that are removably used with a device 50 shown in FIG. 6.

The device 50 may be, for example, a hand-held or portable electronic equipment, such as a digital camera, an audio player, an electronic dictionary, an electronic game or puzzle, etc. Accordingly, the memory holder 20, and in particular the pocket 22 and the opening 25, are sized and shaped to accommodate the size and shape of a variety of memory components 100, and are not restricted to the sizes and shapes shown in FIG. 1, which is merely illustrative.

The body 19 of the memory holder 20 may be made of a durable anti-static material, such as polyethylene, to avoid static discharges that may be potentially harmful to the memory components 100. The body 19 can also be made from other materials, such as leather, fabric, vinyl, etc. Such alternative embodiments may be lined with an anti-static protective lining 21 to form an electro-static shield for any component or object placed into the pocket 22.

Additionally, resistance to damage through breakage and protection from adverse environmental and weather conditions including humidity, rain, undesirable fluctuations in temperature and so on, may be provided inherently by the material of the body 19 or by adding a conventional padding or insulation material 23 contained within the body 19. See FIG. 2.

Figure 7:
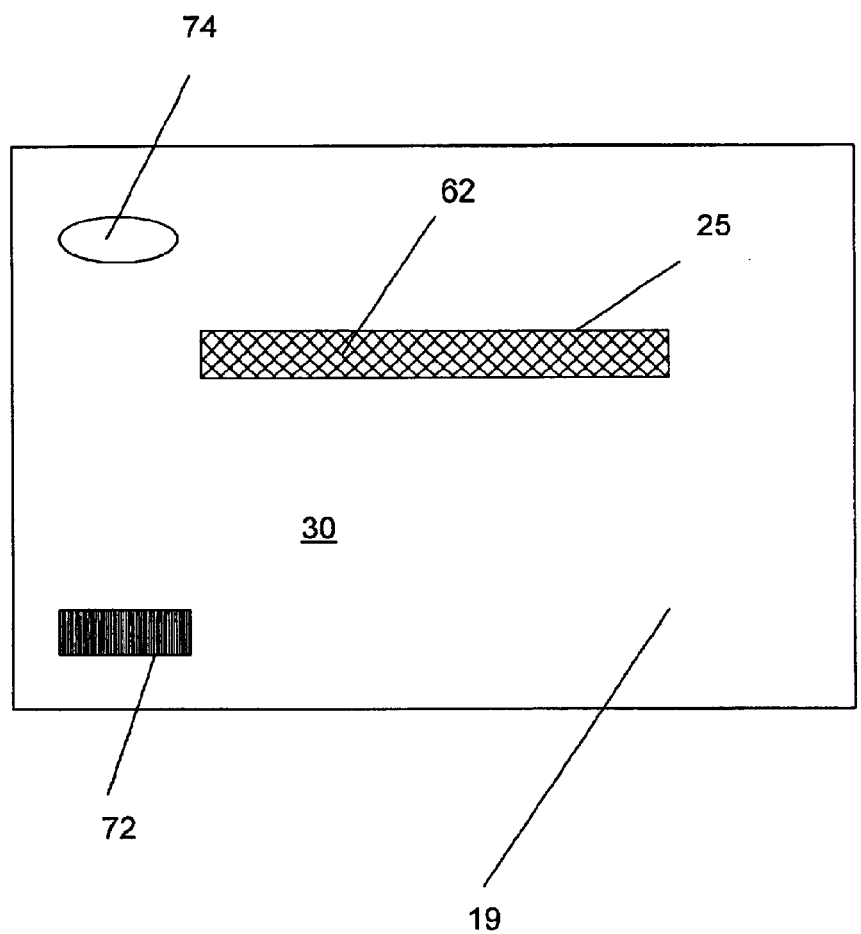
FIG. 7 is a front view of an embodiment of a memory holder according to the present invention.

The memory holder 20 may also include a pocket closure 24 to cover the opening 25. The pocket closure 24 may be, for example, an integral flap or a similar lid that may be retained in a "closed" position, illustrated in FIG. 1 by a conventional male and female snap 26. The pocket closure 24 could conceivably comprise a zipper 62 attached to the periphery of the opening 25, as shown in FIG. 7 or any other closure that prevents the memory component(s) from inadvertently falling out of the opening 25, thus securing the memory component(s) in the pocket 22. The opening 25 may be aligned along a side of the body 19 or may be located anywhere on the body 19, such as, for example, on a front surface 30. See FIGS. 2 and 7.

Figure 3:
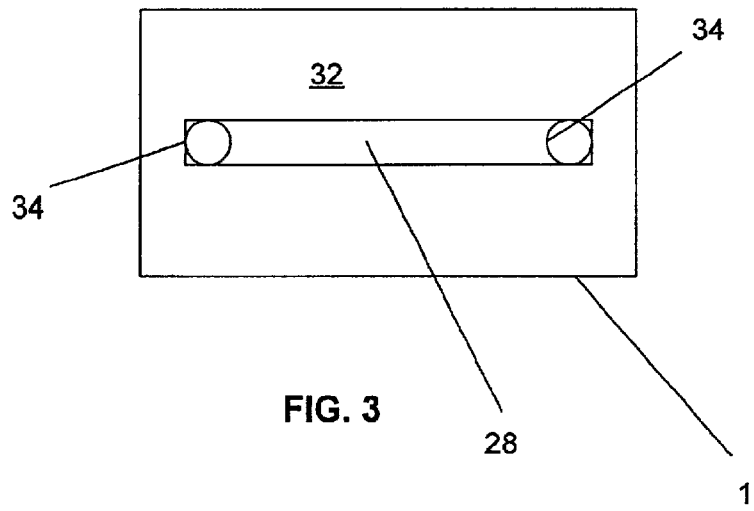
FIG. 3 is a rear view of an embodiment of a memory holder according to the present invention.
Figure 4:
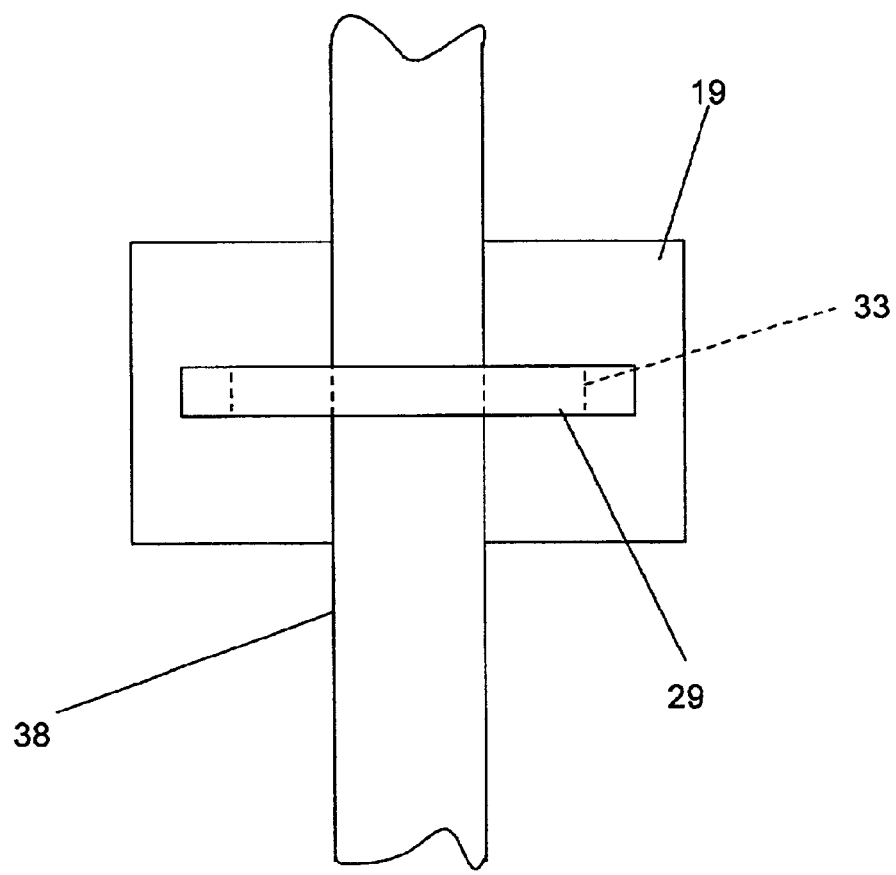
FIG. 4 is a rear view of another embodiment of embodiment of a memory holder according to the present invention showing the memory holder attached to a device strap.

In one embodiment, the memory holder 20 may be provided with a retainer 28 for coupling the memory holder 20 to a portion of a device 50, such as a camera neck strap 38 or similar structure. See FIG. 3. More particularly, and with reference to FIG. 4, the retainer 28 may comprise an elongate member 29 that is attached to the rear surface 32 of the body 19. In embodiments wherein the body 19 is formed from a polymeric material, it is conceivable that the strap may be integrally formed into the rear surface 32 of the body 19 to define a strap-receiving opening 33 through which a strap 38 or similar structure may be inserted. See FIG. 4.

In other embodiments, the elongate member 29 may be formed from polymeric materials, cloth, canvas, leather, etc., attached to the rear surface 32 of the body 19 by fastening means 34, such as, for example, adhesive, snaps, screws, rivets, hook and loop material, etc. See FIG. 3.

Figure 8:
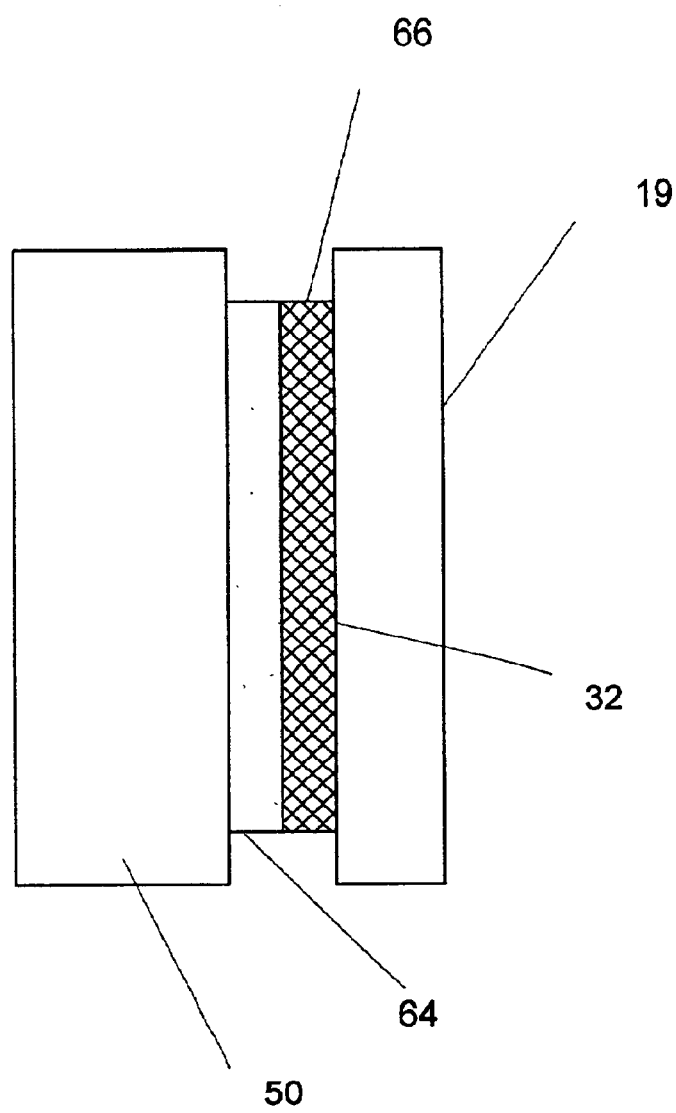
FIG. 8 is a side view an embodiment of a memory holder according to the present invention, wherein the memory holder is shown attached to a device.

In yet another embodiment shown in FIG. 8, a first piece of hook and loop material 64 may be attached to a portion of a device 50, such as a camera, a device carrying case, etc., and a second piece 66 may be attached to the rear surface 32 of the body 19 to enable the memory holder 20 to be removably attached to the device 50 by mating the first and second pieces of hook and loop material 64, 66.

Figure 5:
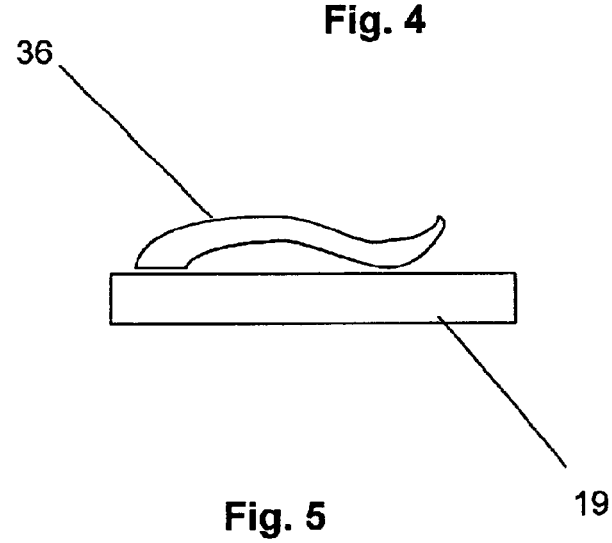
FIG. 5 is a side view of another embodiment of a memory holder according to the present invention.

Alternatively, as shown in FIG. 5, the retainer 28 may be a clip 36, which removably attaches to a strap 38 or to some other surface, of the device 50 or a device-carrying case.

In yet another embodiment of the present invention, the memory holder 20 may be provided with a conventional male/female snap member 46 to removably mate with a corresponding snap member 48 affixed to the device strap 38 or similar structure or to the device 50 itself to enable the memory holder 20 to be removably affixed thereto. Other fastener arrangements may also be employed without departing from the spirit and scope of the present invention.

Other embodiments of the memory holder 20 may include identifying indicia 72, such as logos, trademarks, part numbers, etc. on the body 19. The indicia 72 may also include memory size, i.e. storage capacity, designations, such as, for example, 2 MB, 64 KB, etc. Color indicia 74 covering a portion or the entire body 19 may also be used to code for memory size. See FIG. 7.

It should appreciated from the foregoing that the memory holder 20 provides an convenient, inexpensive and secure method of removably attaching one or more memory components or similar parts to a device for which they are intended, while providing protection against electrostatic discharges, accidental breakage, the weather, etc.

Whereas particular embodiments of the invention have been described herein for the purpose of illustrating the invention and not for the purpose of limiting the same, it will be appreciated by those of ordinary skill in the art that numerous variations of the details, materials and arrangement of parts may be made within the principle and scope of the invention without departing from the spirit invention. The preceding description, therefore, is not meant to limit the scope of the invention. Rather the scope of the invention is to be determined only by the appended claims and their equivalents.

What is claimed is:

1. In combination, a holder and a removable memory component of a device, comprising:

a removable memory component; and a holder, comprising:

a body having a pocket therein sized to receive the removable memory component of the device therein through a pocket opening in the body;

a reclosable pocket closure attached to the pocket and completely covering the pocket opening; and a retainer removably attaching the body to at least a portion of the device, wherein the removable memory component is adapted to be employed with the device.

2. The holder of claim 1, wherein the body is formed from an anti-static material.

3. The holder of claim 1, wherein the pocket is lined with an anti-static material.

4. The holder of claim 1, wherein the retainer comprises a piece of hook and loop material attached to the body and to a portion of the device.

5. The holder of claim 1, wherein the retainer comprises a clip attached to the body and attachable to at least a portion of the device.

6. The holder of claim 1, wherein the retainer comprises a recess formed in the body and sized to detachably receive a correspondingly-shaped protrusion on the device.

7. The holder of claim 1, wherein the retainer comprises a strap-receiving loop coupled to the body.

8. The holder of claim 7, wherein the strap-receiving loop is integrally formed with the body.

9. The holder of claim 7, wherein the strap-receiving loop comprises an elongate member coupled to the body and forming a strap-receiving opening between the elongate member and the pocket.

10. The holder of claim 9, wherein the elongate member is coupled to the body by fasteners selected from the group consisting of adhesive, screws, rivets, snaps, and hook and loop material.

11. The holder of claim 1, wherein the reclosable pocket closure is a zipper formed in the body.

12. The holder of claim 1, wherein the reclosable pocket closure is a flap affixed to a portion of the body and detachably attached to another portion of the holder such that it covers the pocket opening.

13. The holder of claim 1, further comprising an insulating material in the pocket.

14. The holder of claim 1, further comprising removable memory component identifying indicia on the body.

15. The holder of claim 14, wherein the indicia include color.

16. The holder of claim 14, wherein the indicia indicate the memory storage capacity of the removable memory component.

17. The holder of claim 1, wherein the body is formed from material selected from the group consisting essentially of polymeric material, cloth, leather and canvas.

18. In combination, a holder and a removable memory component of a device, comprising:

a removable memory component; and a holder, comprising:

means for supporting the removable memory component having an opening, the means for supporting not forming a part of the device;

means for selectively retaining the removable memory component within the means for supporting, the means for selectively retaining completely covering the opening and attached to the means for supporting; and means for removably attaching the means for supporting to at least a portion of the device, wherein the removable memory component is adapted to be employed with the device.

* * * * *